(12) United States Patent
Mignot et al.

(10) Patent No.: US 11,328,954 B2
(45) Date of Patent: May 10, 2022

(54) BI METAL SUBTRACTIVE ETCH FOR TRENCH AND VIA FORMATION

(71) Applicant: INTERNATIONAL BUSINESS MACHINES CORPORATION, Armonk, NY (US)

(72) Inventors: Yann Mignot, Slingerlands, NY (US); Chanro Park, Clifton Park, NY (US); Chih-Chao Yang, Glenmont, NY (US); Injo Ok, Loudonville, NY (US); Hsueh-Chung Chen, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 210 days.

(21) Appl. No.: 16/817,988

(22) Filed: Mar. 13, 2020

(65) Prior Publication Data
US 2021/0287940 A1 Sep. 16, 2021

(51) Int. Cl.
*H01L 21/768* (2006.01)

(52) U.S. Cl.
CPC .. *H01L 21/76892* (2013.01); *H01L 21/76832* (2013.01)

(58) Field of Classification Search
CPC .. H05K 2201/0361; H05K 2201/10338; H01L 21/76832; H01L 21/76838; H01L 21/76892; H01L 21/76861; H01L 21/76853; H01L 21/768; H01L 21/3213; H01L 21/76885; H01L 21/7684; H01L 21/76844
See application file for complete search history.

(56) References Cited

U.S. PATENT DOCUMENTS

| 4,670,091 A | * | 6/1987 | Thomas | ............ H01L 21/76885 |
|---|---|---|---|---|
| | | | | 438/626 |
| 8,357,609 B2 | | 1/2013 | Ryan | |
| 8,716,127 B2 | | 5/2014 | Yang | |
| (Continued) | | | | |

OTHER PUBLICATIONS

Nakahara, et al., "Etching technique for ruthenium with a high etch rate and high selectivity using zone gas", Journal of Vacuum Science & Technology B: Microelectronics and Nanometer Structures Processing, Measurement, and Phenomena, Nov./Dec. 2001 [accessed on Mar. 6, 2020], 5 pages, vol. 19, No. 6, American Institute of Physics, Retrienved from the Internet: <URL: ttps://doi.org/10.1116/1.1415517>.

(Continued)

*Primary Examiner* — Thanhha S Pham
(74) *Attorney, Agent, or Firm* — Samuel A. Waldbaum

(57) ABSTRACT

Embodiments of the present invention disclose a method forming a via and a trench. By utilizing a first etching process, a first metal layer of a multi-layered device to form a via, wherein the multi-layered device comprises the first metal layer and a second metal layer, wherein the first metal layer is formed directly on top of the second metal layer, wherein the second metal layer acts as an etch stop for the first etching process, wherein the first etching process does not affect the second metal layer. By utilizing a second etching process, the second metal layer of the multi-layered device to form a trench, wherein first metal layer is not affected by the second etching process, wherein the first etching process and the second etching process are two different etching process.

17 Claims, 5 Drawing Sheets

(56) References Cited

U.S. PATENT DOCUMENTS

| | | |
|---|---|---|
| 9,076,847 B2 | 7/2015 | Angyal |
| 9,646,881 B2 | 5/2017 | Bruce |
| 9,786,597 B2 | 10/2017 | Chang |
| 9,793,163 B2 | 10/2017 | Bristol |
| 9,852,980 B2 | 12/2017 | Bonilla |
| 9,859,160 B2 | 1/2018 | Murray |
| 10,020,223 B1 | 7/2018 | Anderson |
| 10,079,184 B2 | 9/2018 | Matsuda |
| 10,083,882 B2 | 9/2018 | Balakrishnan |
| 10,115,670 B2 | 10/2018 | Edelstein |
| 10,199,264 B2 | 2/2019 | Zhang |
| 2014/0127906 A1* | 5/2014 | Cabral, Jr. ........ H01L 21/32131 438/694 |
| 2014/0284802 A1 | 9/2014 | Sakata |
| 2015/0056800 A1 | 2/2015 | Mebarki |
| 2017/0154785 A1 | 6/2017 | Yoshimizu |
| 2017/0287784 A1 | 10/2017 | Leobandung |
| 2017/0372950 A1 | 12/2017 | Yoo |
| 2021/0125864 A1* | 4/2021 | Jiang ................. H01L 21/30621 |

OTHER PUBLICATIONS

Paolillo, et al., "Direct metal etch of ruthenium for advanced interconnect", Journal of Vacuum Science & Technology B, May/Jun. 2018 [accessed on Mar. 6, 2020], 10 pages, American Vacuum Society, Retrieved from the Internet: <URL: https://avs.scitation.org/toc/jvb/36/3>.

Wan et al., "Subtractive etch of ruthenium for sub-5nm interconnect," International Interconnect Technology Conference (IITC), 2018, pp. 10-12.

* cited by examiner

BI METAL SUBTRACTIVE ETCH FOR TRENCH AND VIA FORMATION

BACKGROUND

The present invention relates generally to the field of integrated circuit, and more particularly to formation of a via and trench.

BRIEF SUMMARY

Additional aspects and/or advantages will be set forth in part in the description which follows and, in part, will be apparent from the description, or may be learned by practice of the invention.

Embodiments of the present invention disclose a method forming a via and a trench. By utilizing a first etching process, a first metal layer of a multi-layered device to form a via, wherein the multi-layered device comprises the first metal layer and a second metal layer, wherein the first metal layer is formed directly on top of the second metal layer, wherein the second metal layer acts as an etch stop for the first etching process, wherein the first etching process does not affect the second metal layer. By utilizing a second etching process, the second metal layer of the multi-layered device to form a trench, wherein first metal layer is not affected by the second etching process, wherein the first etching process and the second etching process are two different etching process.

BRIEF DESCRIPTION OF THE DRAWINGS

The above and other aspects, features, and advantages of certain exemplary embodiments of the present invention will be more apparent from the following description taken in conjunction with the accompanying drawings, in which.

DETAILED DESCRIPTION

Figure 1:
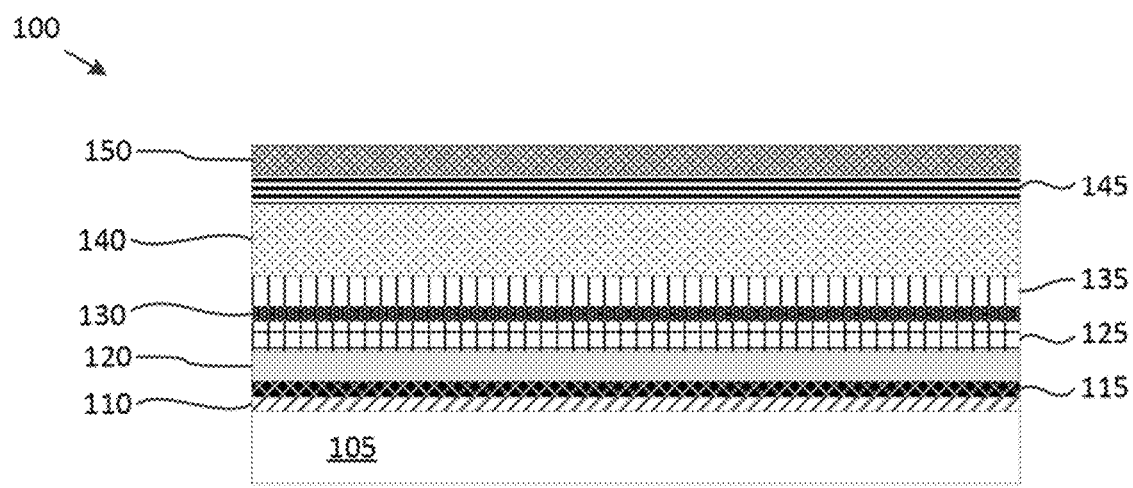
FIG. 1 illustrates a cross section of a multi-layered device, in accordance with an embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and the words used in the following description and the claims are not limited to the bibliographical meanings, but, are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is understood that the singular forms "a," "an," and "the" include plural referents unless the context clearly dictates otherwise. Thus, for example, reference to "a component surface" includes reference to one or more of such surfaces unless the context clearly dictates otherwise.

Detailed embodiments of the claimed structures and the methods are disclosed herein: however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the present embodiments.

References in the specification to "one embodiment," "an embodiment," an example embodiment," etc., indicate that the embodiment described may include a particular feature, structure, or characteristic, but every embodiment may not include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art of affect such feature, structure, or characteristic in connection with other embodiments whether or not explicitly described.

For purpose of the description hereinafter, the terms "upper," "lower," "right," "left," "vertical," "horizontal," "top," "bottom," and derivatives thereof shall relate to the disclosed structures and methods, as orientated in the drawing figures. The terms "overlying," "atop," "on top," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating, or semiconductor layer at the interface of the two elements.

In the interest of not obscuring the presentation of embodiments of the present invention, in the following detailed description, some processing steps or operations that are known in the art may have been combined together for presentation and for illustrative purposes and in some instance may have not been described in detail. In other instances, some processing steps or operations that are known in the art may not be described at all. It should be understood that the following description is rather focused on the distinctive features or elements of various embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or indirect coupling, and a positional relationship between entities can be direct or indirect positional relationship. As an example of indirect positional relationship, references in the present description to forming layer "A" over layer "B" includes situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing" or any other variation thereof, are intended to cover a non-exclusive inclusion. For example, a composition, a mixture, process, method, article, or apparatus that comprises a list of elements is not necessarily limited to only those elements but can include other element not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiment or designs. The terms "at least one" and "one or more" can be understood to include any integer number greater than or equal to one, i.e., one, two, three, four, etc. The terms "a plurality" can be understood to include any integer number greater than or equal to two, i.e. two, three, four, five, etc. The term "connection" can include both indirect "connection" and a direct "connection."

As used herein, the term "about" modifying the quantity of an ingredient, component, or reactant of the invention employed refers to variation in the numerical quantity that can occur, for example, through typical measuring and liquid handling procedures used for making concentrations or solutions. Furthermore, variation can occur from inadvertent error in measuring procedures, differences in manufacture, source, or purity of the ingredients employed to make the compositions or carry out the methods, and the like. The terms "about" or "substantially" are intended to include the degree of error associated with measurement of the particular quantity based upon the equipment available at the time of the filing of the application. For example, about can include a range of ±8%, or 5%, or 2% of a given value. In another aspect, the term "about" means within 5% of the reported numerical value. In another aspect, the term "about" means within 10, 9, 8, 7, 6, 5, 4, 3, 2, or 1% of the reported numerical value.

Various process used to form a micro-chip that will packaged into an integrated circuit (IC) fall in four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etching process (either wet or dry), reactive ion etching (RIE), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implant dopants. Films of both conductors (e.g. aluminum, copper, etc.) and insulators (e.g. various forms of silicon dioxide, silicon nitride, etc.) are used to connect and isolate electrical components. Selective doping of various regions of the semiconductor substrate allows the conductivity of the substrate to be changed with the application of voltage.

Reference will now be made in detail to the embodiments of the present invention, examples of which are illustrated in the accompanying drawings, wherein like reference numerals refer to like elements throughout. One of the leading via and trench formation schemes is using a subtractive patterning technique, which requires to etch metal line (such as Ru) to form metal line and/or Via (Top via). However, utilizing a subtractive patterning technique comes with some roadblocks and downstream limitations. Forming a top via and trench requires a precise etch time control to avoid catastrophic over or under etching the trench while etching a single metal layer. The over or under etching can cause defects in the device which can affect the quality and process of the device. The over etching can cause damage to underlying layers of the device and the under etching can leave a connection between components because the trench was not fully formed.

Embodiments of the invention are generally directed to an apparatus and method for forming a bimetal via and trench. By utilizing a bi metal structure in the formation of the via and trench, the over or under etching problem when using a signal metal layer in the trench and via formation can be avoided. The over or under etching problem can be avoid by having the bottom metal layer acting as an etch stop when the top metal layer is being etched for the formation of the via. The bi metal formation also reduces the formation of "bamboo" grains in the metal layers during the deposition process. Furthermore, by utilizing a bi metal structure, then the resistance of the across the bi metal structure can be modulate. The resistance can be modulated by changing the physical characteristics of either of the metal layers. The Resistance is defined base on the metal volume (R constant). So, having bi metal structure to make a connection the $R_{total} = R_{top} + R_{bottom}$. The resistance R can be modulated based on the combined metal volume of the top and lower metal layers. A multi-layered device is etched to form the via in a first metal layer. During the etching process of the first metal layer, a second metal layer acts as an etch stop for the etching process of the first metal layer. This prevents the over or under etching of the first metal layer. A second etching process is performed to etch a trench in a second metal layer. The material chosen for the second metal layer is dependent on that material working as a etch stop for the etching process utilizing in etching the first metal layer.

FIG. 1 illustrates a cross section of a multi-layered device 100, in accordance with an embodiment of the present invention. The multi-layered device 100 has a bottom layer 105, where the bottom layer 105 can be, for example, a substrate, a silicon wafer, a sapphire wafer, an underlying layer of a different material of the multi-layered device 100. A block layer 110 is formed on top of the bottom layer 105. The block layer 110 can be comprised of different metals or other materials that will prevent the diffusion or migration of materials into the second metal layer 120. The block layer 110 has a thickness in the range of about 5 to 15 nm. An intermediate layer 115 is formed on top of the block layer 110, where the intermediate layer 115 can be comprised of, for example, TaN. The intermediate layer 115 has a thickness of about 2 nm.

The second metal layer 120 is formed on top of the intermediate layer 115. The second metal layer 120 can be comprised of, for example, Ru and have a thickness in a range of about 20 to 50 nm. The first metal layer 125 is formed on top of the second metal layer 120. The first metal layer can be comprised of, for example, Co, Ti, Ta, or W, where the first metal layer 125 has a thickness of about 20 to 100 nm. An adhesion layer 130 is formed on top of the first metal layer 125. The adhesion layer 130 can be comprised of, for example, SiCN having a thickness of about 4 nm. A mask 135 is formed on top of the adhesion layer 130. The mask 135 can be comprised of, for example, a hard mask TEOS or a low temperature oxide, where the mask 135 has a thickness in the range of about 20 to 40 nm.

A planarization layer 140 is formed on top of the mask 135. The planarization layer 140 can be comprised of an organic layer planarization layer, where the planarization layer 140 has a thickness in the range of 40 to 200 nm. An antireflection coating layer 145 is formed on top of the planarization layer 140. The antireflection coating 145 can be comprised of a silicon containing antireflection coating (Siarc), a low temperature oxide, or an organic containing antireflection coating. The antireflection coating 145 has a thickness in the range of 5 to 40 nm. A resist coating 150 is formed on top of the antireflection coating layer 145. The resist coating 150 can be, for example, performed with an extreme UV (EUV) lithographic process, having a thickness in the range of about 20 to 50 nm.

Figure 2:
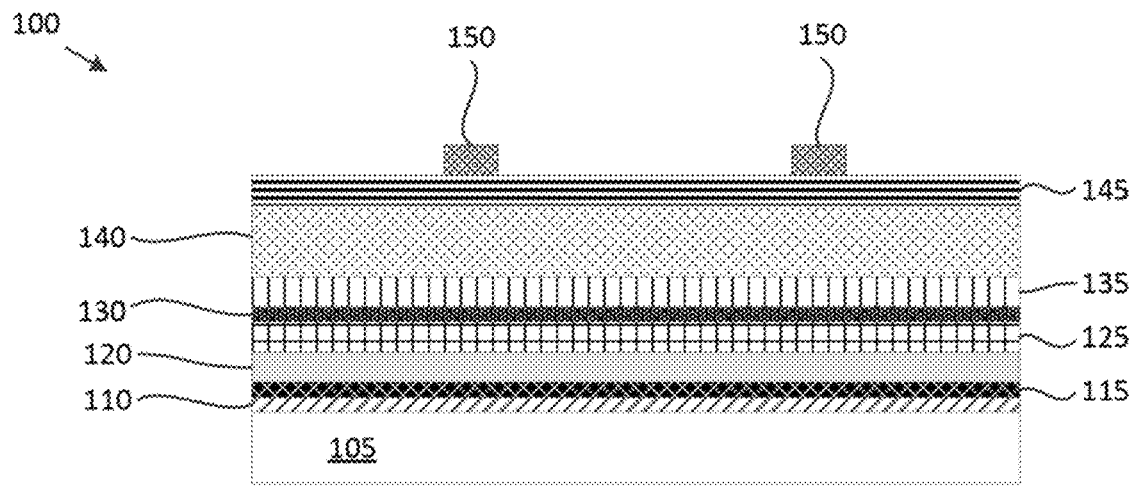
FIG. 2 is a cross section of a multi-layered device illustrating the pattering of a resist layer for via formation, in accordance with an embodiment of the present invention.

FIG. 2 is a cross section of a multi-layered device 100 illustrating the patterning of a resist layer 150 for via formation, in accordance with an embodiment of the present invention. The resist layer 150 can be patterned to determine where the vias in the first metal layer 125 will be formed.

Figure 3:
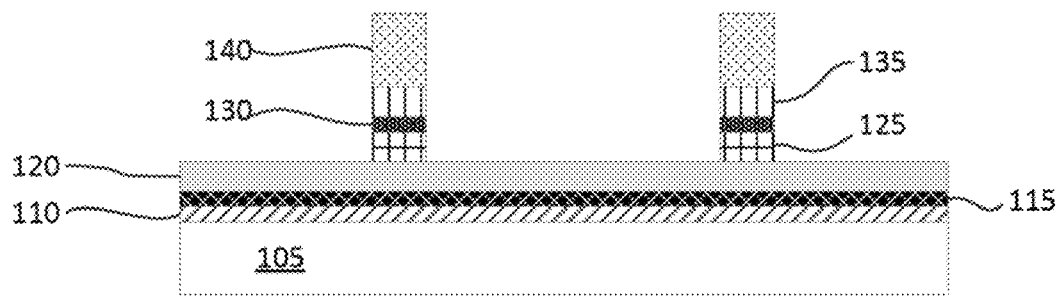
FIG. 3 is a cross section of a multi-layered device illustrating the etched formation of the vias, in accordance with an embodiment of the present invention.

FIG. 3 is a cross section of a multi-layered device 100 illustrating the etched formation of the vias, in accordance with an embodiment of the present invention. The via is etched into the planarization layer 140, the mask layer 135, the adhesion layer 130, and the first metal layer 125. The etch process uses a plasma reactor to generate active species (gas) to attract them onto the surface to react with the different materials, specifically the first metal layer 125. The etching process is using a specific etch gas such as BCl3 and Cl2 that will target the first metal layer 125. The etch gases have a minimal reaction with the second metal layer 120, so the first metal layer 125 can be removed with minimal to no impact on the second metal layer 120. This allows for the second metal layer 120 to act as an etch stop for the etching process of the first metal layer 125. Since the second metal layer 120 is not removed by the etch process utilized to form the via, then the second metal layer 120 acts as a stop layer for the etching process preventing an over or under etching of the first metal layer 125.

Figure 4:
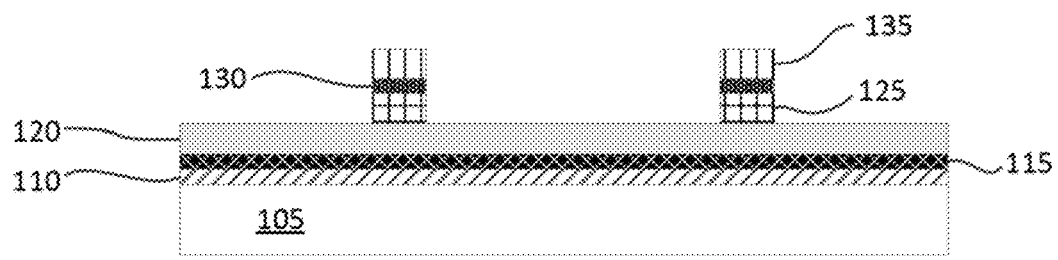
FIG. 4 is a cross section of a multi-layered device illustrating the removal of a layer, in accordance with an embodiment of the present invention.

FIG. 4 is a cross section of a multi-layered device 100 illustrating the removal of a planarization layer 140, in accordance with an embodiment of the present invention. The planarization layer 140 that remains on the multi-layered device 100 is removed to allow the formation of new layers on the exposed surfaces of the multi-layered device 100.

Figure 5:
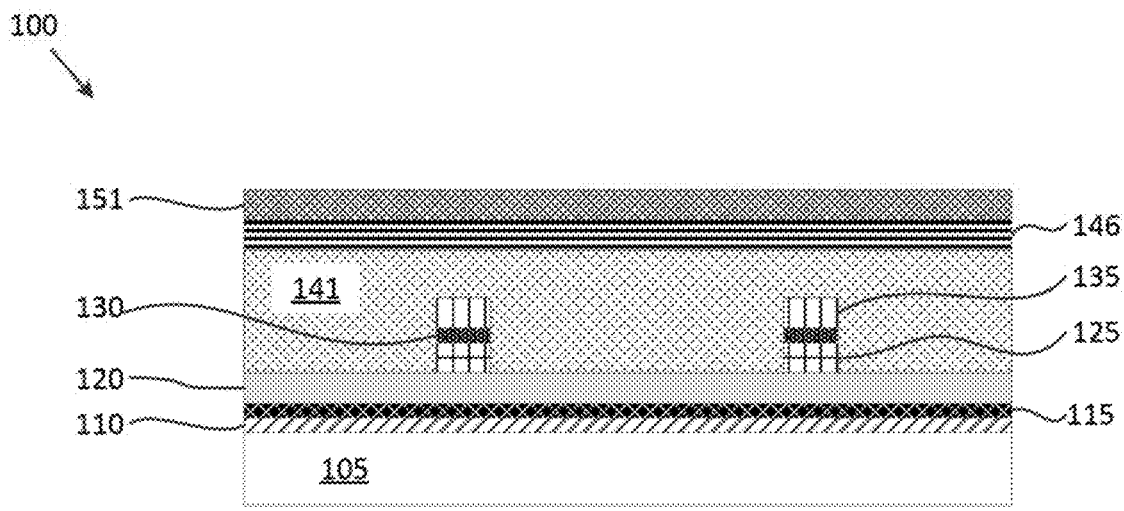
FIG. 5 is a cross section of a multi-layered device illustrating the formation of additional layers, in accordance with an embodiment of the present invention.

FIG. 5 is a cross section of a multi-layered device 100 illustrating the formation of additional layers, in accordance with an embodiment of the present invention. A second planarization layer 141 is formed on the exposed surfaces of the second metal layer 120 and on the exposed surfaces of the via column by the first etching process. The second planarization layer 141 can be comprised of the same material as the planarization layer 140 or it can be a different material. The second planarization layer 141 has a different thickness at different locations, for example, it will have a thickness A at a location directly above the second metal layer 120 and have a thickness B directly above the via column. Where thickness A is larger than thickness B. A second antireflection layer 146 is formed on top of the second planarization layer 141. The second antireflection layer 146 can be comprised of the same material as the antireflection layer 145 or it can be a different material. The second antireflection layer 146 has a thickness in the range of 5 to 40 nm. A second resist coating 151 is formed on top of the second antireflection layer 146. The second resist coating 151 can be the same resist material as the resist coating 150 or it can be a different coating. The second resist coating 151 can be form, for example, with an EUV lithographic process, having a thickness in the range of about 20 to 50 nm.

Figure 6:
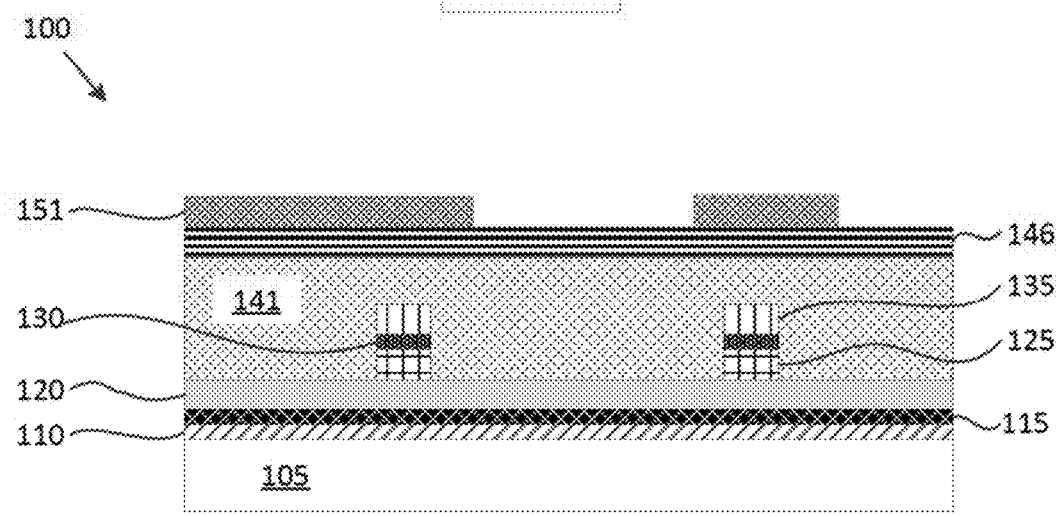
FIG. 6 is a cross section of a multi-layered device illustrating the pattering of a second resist coating for trench formation, in accordance with an embodiment of the present invention.

FIG. 6 is a cross section of a multi-layered device 100 illustrating the patterning of the second resist coating 151 for trench formation, in accordance with an embodiment of the present invention. The second resist coating 151 is patterned to determine where the trenches will be formed during the etching process.

Figure 7:
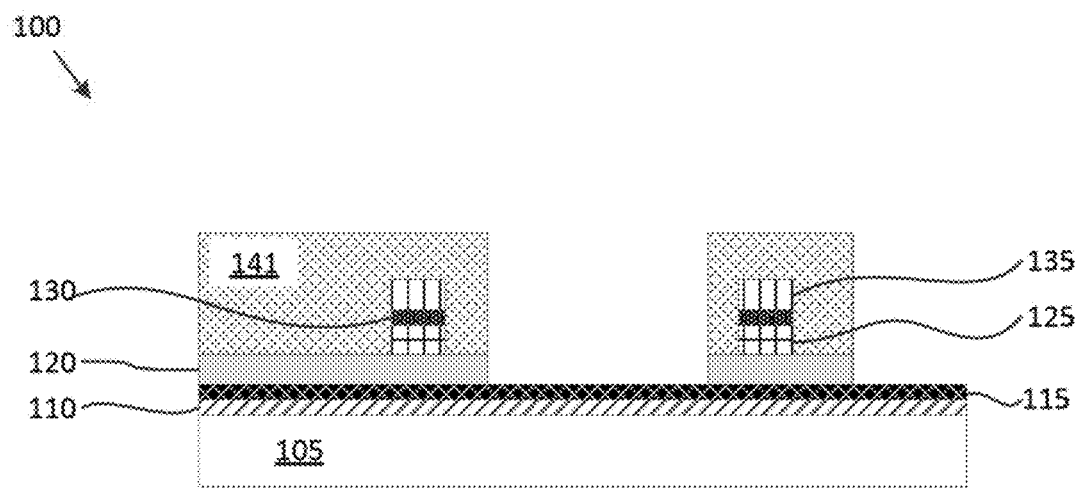
FIG. 7 is a cross section of a multi-layered device illustrating the etching of the trench, in accordance with an embodiment of the present invention.

FIG. 7 is a cross section of a multi-layered device 100 illustrating the etching of the trench, in accordance with an embodiment of the present invention. The etching process forms a trench in the second metal layer 120. The first metal layer 125 is not affected by the second etching process since it encapsulated by the second planarization layer 141. The material of the second planarization layer 141 is removed along with the material of the second metal layer 120 at the location where the trenches will be formed. The FIG. 7 illustrates that all the material of the second metal layer 120 at the desired locations was removed to form the trench, however, the depth of the trench can be controlled by the etching process such that only a portion of the second metal layer 120 could be removed. By utilizing a bimetal layer layout, the duel etching process used to form the via and the trench allows for the greater control over the etching process. This prevents under or over etching when forming a via and a trench simultaneously in a signal metal layer.

Figure 8:
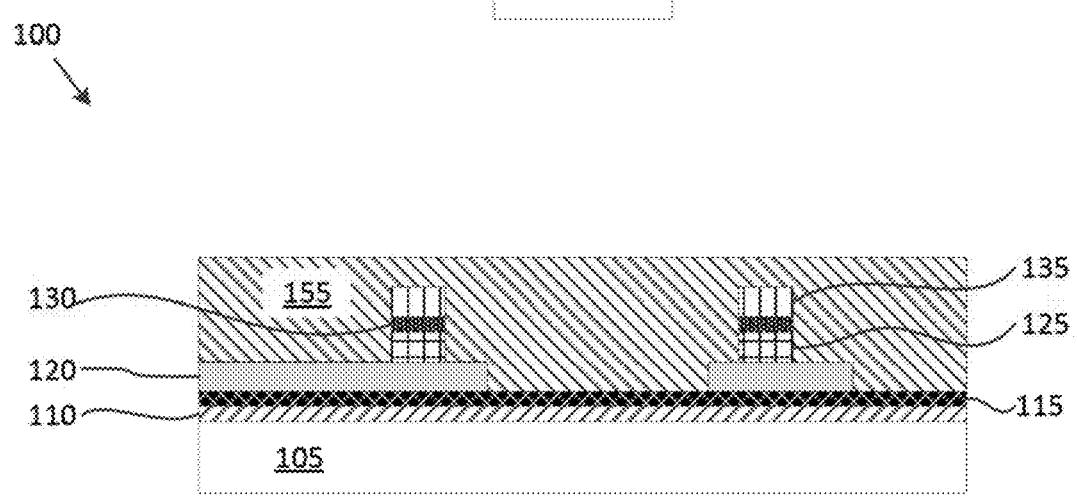
FIG. 8 is a cross section of a multi-layered device illustrating the formation of a dielectric layer, in accordance with an embodiment of the present invention.

FIG. 8 is a cross section of a multi-layered device 100 illustrating the formation of a dielectric layer 155, in accordance with an embodiment of the present invention. The second planarization layer 141 is removed and a dielectric layer 155 is formed on the exposed surfaces. The dielectric layer 155 is comprised of an ultra-low-k dielectric material.

Figure 9:
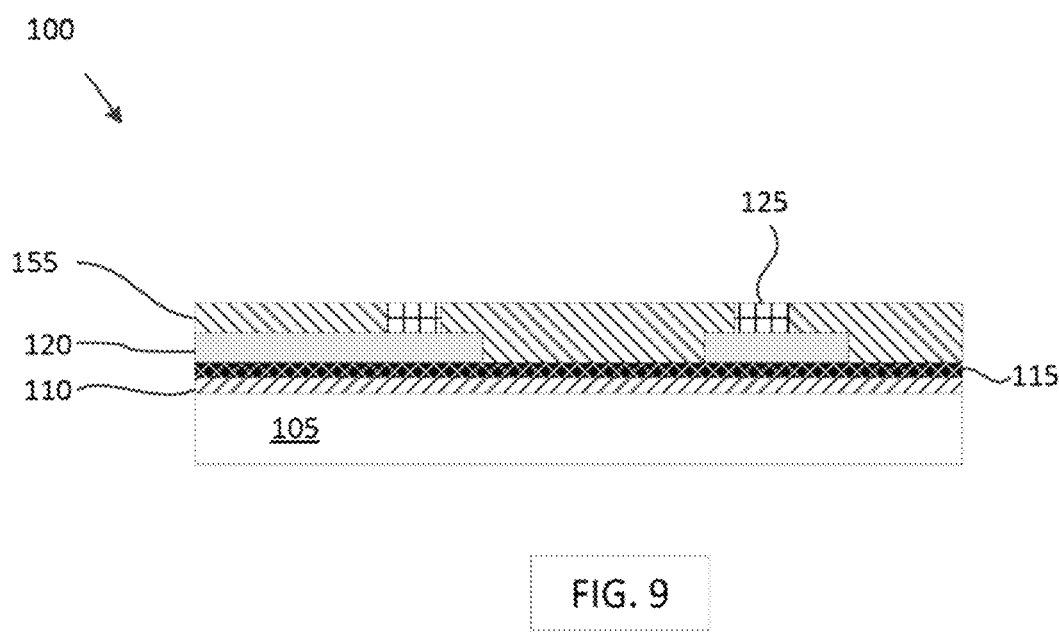
FIG. 9 is a cross section of a multi-layered device illustrating the removal of the layers to form a planar surface, in accordance with an embodiment of the present invention.

FIG. 9 is a cross section of a multi-layered device 100 illustrating the removal of the layers to form a planar surface, in accordance with an embodiment of the present invention. The material of the multi-layered device 100 is then planarized to expose the top surface of the first metal layer 125. The planarization process will remove any materials or layer located on top of the first metal layer 125.

When forming a via in a signal metal layer it runs the risk of over etching the vias, furthermore, when forming the trench along with the via in the signal mental layer it is possible to perform an over or under etch of the metal layer. Furthermore, when forming the signal metal layer having a thickness large enough to accommodate the formation of the via and trench, can lead to uncontrollable "bamboo" grain growth in the metal layer.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A method forming a via and a trench comprising:
   etching, by utilizing a first etching process, a first metal layer of a multi-layered device to form a via, wherein the multi-layered device comprises the first metal layer and a second metal layer, wherein the first metal layer is formed directly on top of the second metal layer, wherein the second metal layer acts as an etch stop for the first etching process, wherein the first etching process does not affect the second metal layer;
   etching, by utilizing a second etching process, the second metal layer of the multi-layered device to form a trench, wherein the first metal layer is not affected by the second etching process, wherein the first etching process and the second etching process are two different etching processes; and
   forming a planarization layer, after the first etching process but prior to the second etching process, on an exposed surface on the second metal layer and on the exposed surface of the first metal layer, wherein the planarization layer encapsulates the via formed in first metal layer.

2. The method of claim 1, wherein a material of the first metal layer is selected from a group comprised of Co, Ti, Ta, or W.

3. The method of claim 2, wherein the first metal layer has a thickness in a range of about 20 to 100 nm.

4. The method of claim 1, wherein the second metal layer is comprised of Ru.

5. The method of claim 4, wherein the second metal layer has a thickness in a range of about 20 to 50 nm.

6. The method of claim 1, wherein the planarization layer formed directly on the second metal layer has a first thickness and the planarization layer formed directly on the via of the first metal layer has a second thickness.

7. The method of claim 6, wherein the first thickness is greater than the second thickness.

8. The method of claim 1, wherein the encapsulation of the via in the first metal layer by the planarization material prevents the second etching process from affecting first metal layer.

9. The method of claim 1, further comprising:
   forming an antireflection layer on top of the planarization layer.

10. The method of claim 9, wherein the antireflection layer has a thickness in a range of about 5 to 40 nm.

11. The method of claim 9, wherein a material for the antireflection layer is selected from the group consisting of a silicon-containing antireflection coating (Siarc), a low temperature oxide, or an organic containing antireflection coating.

12. The method of claim 1, further comprising:
   after performing the second etching process forming a dielectric layer on an exposed surface of the first metal layer and the second metal layer.

13. The method of claim 12, further comprising:
   planarizing a top surface of the dielectric to expose the via formed in the first metal layer.

14. The method of claim 1, wherein the second metal layer is formed directly on top of an intermediate layer comprised of TaN.

15. The method of claim 14, wherein the intermediate layer has a thickness of about 2 nm.

16. The method of claim 14, wherein the intermediate layer is formed directly on a block layer, wherein the block layer is comprised of a material the prevents diffusion or migration of materials into the second metal layer.

17. The method of claim 16, wherein the block layer has a thickness in a range of about 5 to 15 nm.

* * * * *